United States Patent [19]

Delage et al.

[11] Patent Number: 5,719,433
[45] Date of Patent: Feb. 17, 1998

[54] SEMICONDUCTOR COMPONENT WITH INTEGRATED HEAT SINK

[75] Inventors: Sylvain Delage, Bures S/Yvette; Simone Cassette, Limours; Hervé Blanck, Arcueil; Eric Chartier, Palaiseau, all of France

[73] Assignee: Thomson-CSF, Paris, France

[21] Appl. No.: 672,844

[22] Filed: Jul. 25, 1996

[30] Foreign Application Priority Data

Jul. 25, 1995 [FR] France ............ 95 08994

[51] Int. Cl.⁶ .................................................. H01L 23/367
[52] U.S. Cl. ..................... 257/625; 257/623; 257/706; 257/717; 257/522
[58] Field of Search ............................. 257/618, 623, 257/706, 707, 625, 712, 713, 717, 719, 796, 522

[56] References Cited

U.S. PATENT DOCUMENTS

| | | |
|---|---|---|
| 3,631,719 | 1/1972 | Charvier et al. . |
| 3,792,303 | 2/1974 | Albertin et al. . |
| 3,956,820 | 5/1976 | Swartz et al. . |
| 4,161,701 | 7/1979 | Takeda et al. ............ 257/618 |
| 4,172,656 | 10/1979 | Lacombat et al. . |
| 4,471,291 | 9/1984 | Arnould et al. . |
| 4,697,331 | 10/1987 | Boulitrop et al. . |
| 4,736,234 | 4/1988 | Boulitrop et al. . |
| 4,800,420 | 1/1989 | Choo et al. ............ 257/618 |
| 4,938,567 | 7/1990 | Chartier . |
| 4,959,705 | 9/1990 | Lemnios et al. ............ 257/522 |
| 5,034,799 | 7/1991 | Tomita et al. . |
| 5,194,403 | 3/1993 | Delage et al. . |
| 5,411,632 | 5/1995 | Delage et al. . |

FOREIGN PATENT DOCUMENTS

| | | |
|---|---|---|
| 0 446 125 A1 | 9/1991 | European Pat. Off. . |
| 0252155 | 11/1991 | Japan ............ 257/796 |
| 7-111272 | 4/1995 | Japan . |
| WO 94/15361 | 7/1994 | WIPO . |

*Primary Examiner*—Minh-Loan Tran
*Assistant Examiner*—David B. Hardy
*Attorney, Agent, or Firm*—Oblon, Spivak, McClelland, Maier & Neustadt, P.C.

[57] ABSTRACT

A semiconductor component that could be a power transistor type of component comprises mesa-structured elementary bipolar transistors. This component has a thick, metal heat sink of which a part (PI) takes the form of a bridge and a part is in contact with the substrate. The legs of the bridge lie on the entire unit constituted by the mesas. The heat sink made on the front face of the substrate may be connected to the rear face of the substrate comprising a ground plate. The discharging of the heat is thus appreciably fostered.

8 Claims, 8 Drawing Sheets

SEMICONDUCTOR COMPONENT WITH INTEGRATED HEAT SINK

BACKGROUND OF THE INVENTION

1. Field of the Invention

The field of the invention is that of power semiconductor components and especially that of bipolar transistors which are very valuable in microwave applications.

The invention relates to the introduction of a heat sink into a power component, thus making it possible, for a given working temperature, to increase the power available per unit of surface area of semiconductor.

2. Description of the Prior Art

In the context of power transistors and especially in the context of heterojunction bipolar transistors or HBTs, as a rule, the components are made of group III–V materials and result from a vertical technology. They have at least an emitter "mesa" structure from which the charges flow perpendicularly to the substrate. FIG. 1 shows a standard HBT configuration. A substrate 6 has a collector 3 that may be buried in the substrate 6 on which there lies a base layer 2 which itself bears an emitter layer 1 and a contact-making layer.

The electrical current thus flows through the emitter, base and collector layers E, B, C perpendicularly to their plane. Transistors of this kind are capable of controlling extremely great current density values of up to $2.10^5$ A.cm$^{-2}$ and very high voltages.

This causes major problems of heat dissipation since the collector of the transistor, subjected to very high voltages, undergoes a very high degree of heating. The heat released is all the more difficult to discharge as the structure is a vertical mesa structure.

SUMMARY OF THE INVENTION

In order to resolve this problem of heat dissipation, the invention proposes a component into which there is integrated a metal heat sink. A part of this sink has a arch-like or overhanging structure while its other part lies on the front face of the component.

More specifically, an object of the invention is a semiconductor device having at least one region called a mesa that is embossed with respect to a first face of the substrate called the front face, said region being the source of a substantial release of heat, the "mesa" and the front face being covered with a passivation layer CP, wherein the device includes a thick metal heat sink having:

- an overhanging part PI in the shape of a bridge whose legs lie on the passivation layer CP at the level of a unit forming an embossed "mesa";
- a part PII covering the regions of the front face of the substrate other than those constituting the embossed "mesa".

The semiconductor device according to the invention may include one or more parallel-connected transistors, each transistor having two successive mesas made from the substrate, a first mesa formed by the base, a second mesa formed by the emitter, the first mesa comprising base metallizations mB on each side of the emitter, the second mesa comprising an emitter metallization mE, the overhanging part PI of the heat sink being shaped like a bridge with its legs resting on the layer CP at the level of the unit formed by the metallization mE and the metallization mB.

In a first variant of the invention, the emitter contact CE may be taken at one end of the emitter finger.

An object of the invention also is a semiconductor device as described here above, wherein the passivation layer CP is open locally at the emitter fingers so as to provide a homogeneous electrical contact CE' at the emitter. However, the technological making of this contact CE' is more difficult than that of the contact CE in the first variant of the invention.

This variant of the invention provides a solution to the problem encountered in power devices relating to the non-homogeneity of current injected into one end of the emitters of the elementary transistors.

Indeed, the current is naturally greater in the vicinity of the supply point. This leads to a limiting of the surface area of an elementary transistor, which is typically less than 100 μm$^2$ so as not to exceed current densities of $10^6$ A.cm$^{-2}$.

The semiconductor component according to the invention may advantageously comprise a substrate whose rear face is metallized to form a ground plane connected to the heat sink by means of via holes made in the substrate.

The invention may advantageously be applied to power heterojunction bipolar transistors of the GaInP/GaAs type epitaxially grown on GaAs substrates.

BRIEF DESCRIPTION OF THE DRAWINGS

The invention will be understood more clearly and other advantages shall appear from the following description, given by way of a non-restrictive example and made with reference to the appended figures, of which.

MORE DETAILED DESCRIPTION

Figure 1:
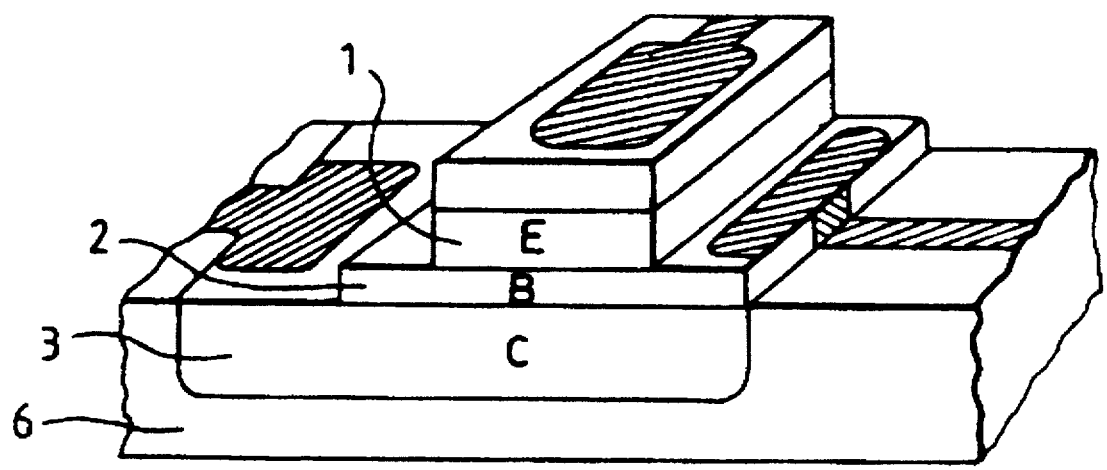
FIG. 1 illustrates a prior art heterojunction bipolar transistor described here above.
Figure 2:
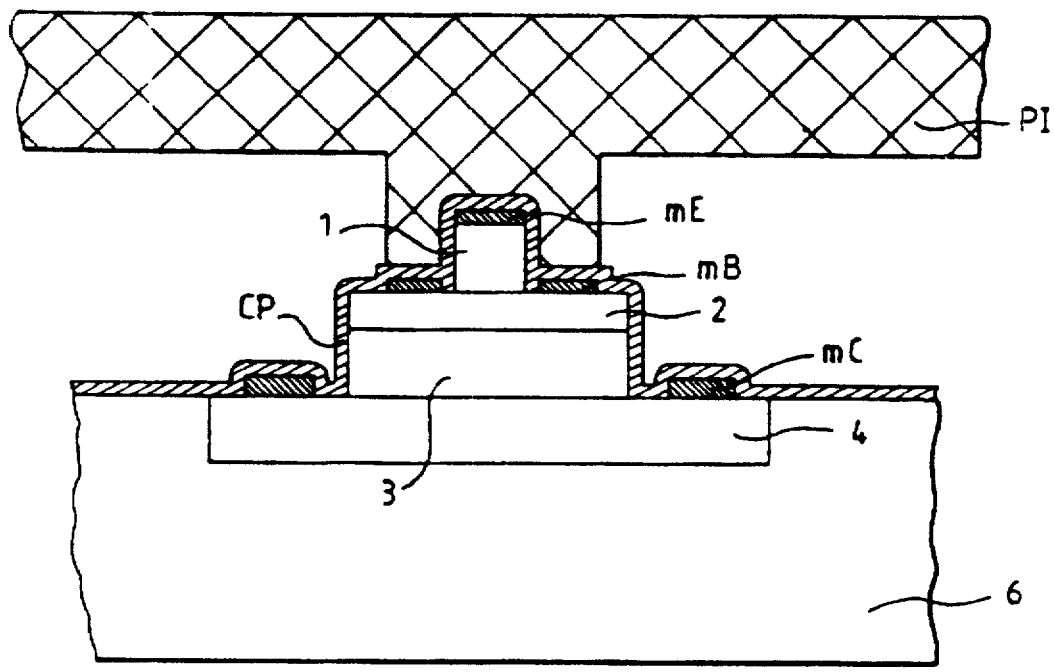
FIG. 2 shows a sectional view of an elementary finger of a power transistor according to a first variant of the invention.

FIG. 2 pertains to an exemplary power transistor according to a first variant of the invention and shows a sectional view of an elementary finger of an HBT component. It illustrates the overhanging part of the metal heat sink that lies on the passivation layer CP, at the level of the base metallizations mB and the emitter metallization mE. Thus, from a semiconductor substrate 6, a buried sub-collector 4 in the substrate, a first mesa 3 forms the collector on each side of which there are metallizations mC enabling contact to be made at the collector.

On the collector, a base layer 2 is partially covered with an emitter layer 1 on each side of which base metallizations mB are made. The emitter for its part is also covered with a metallization mE. The unit is protected by a passivation layer CP. The legs of the bridge forming the overhanging part of the heat sink lie on the layer CP at the metallizations mB and mE.

FIG. 3 illustrates the association of two parallel-connected transistors. In standard components, it is possible typically to set up a parallel association of up to at least four transistors.

Figure 3A:
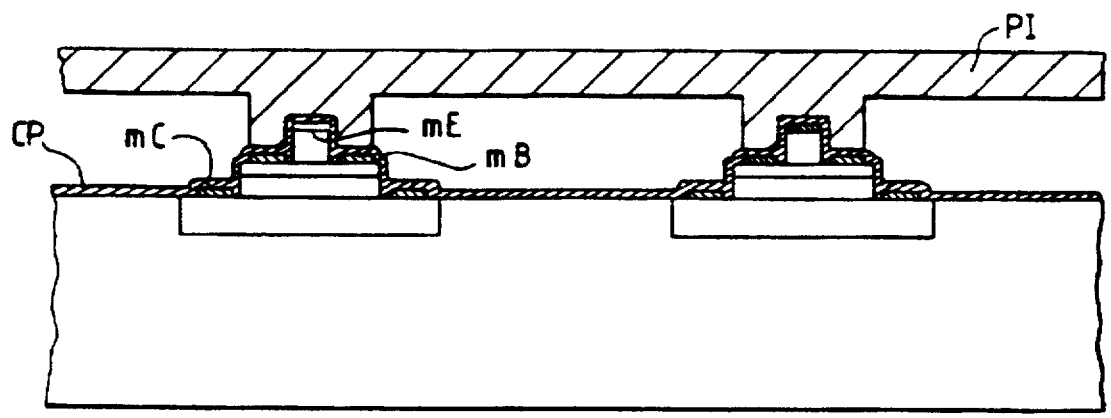
FIG. 3a shows a front view of two parallel-connected transistors in a component according to a first variant of the invention.

FIG. 3a shows the overhanging part PI of the heat sink, taking the form of a bridge, the legs of which lie on the mesas constituted by the emitter and the base. The emitter CE contact is made in a standard way at one end of the emitter finger.

Figure 3B:
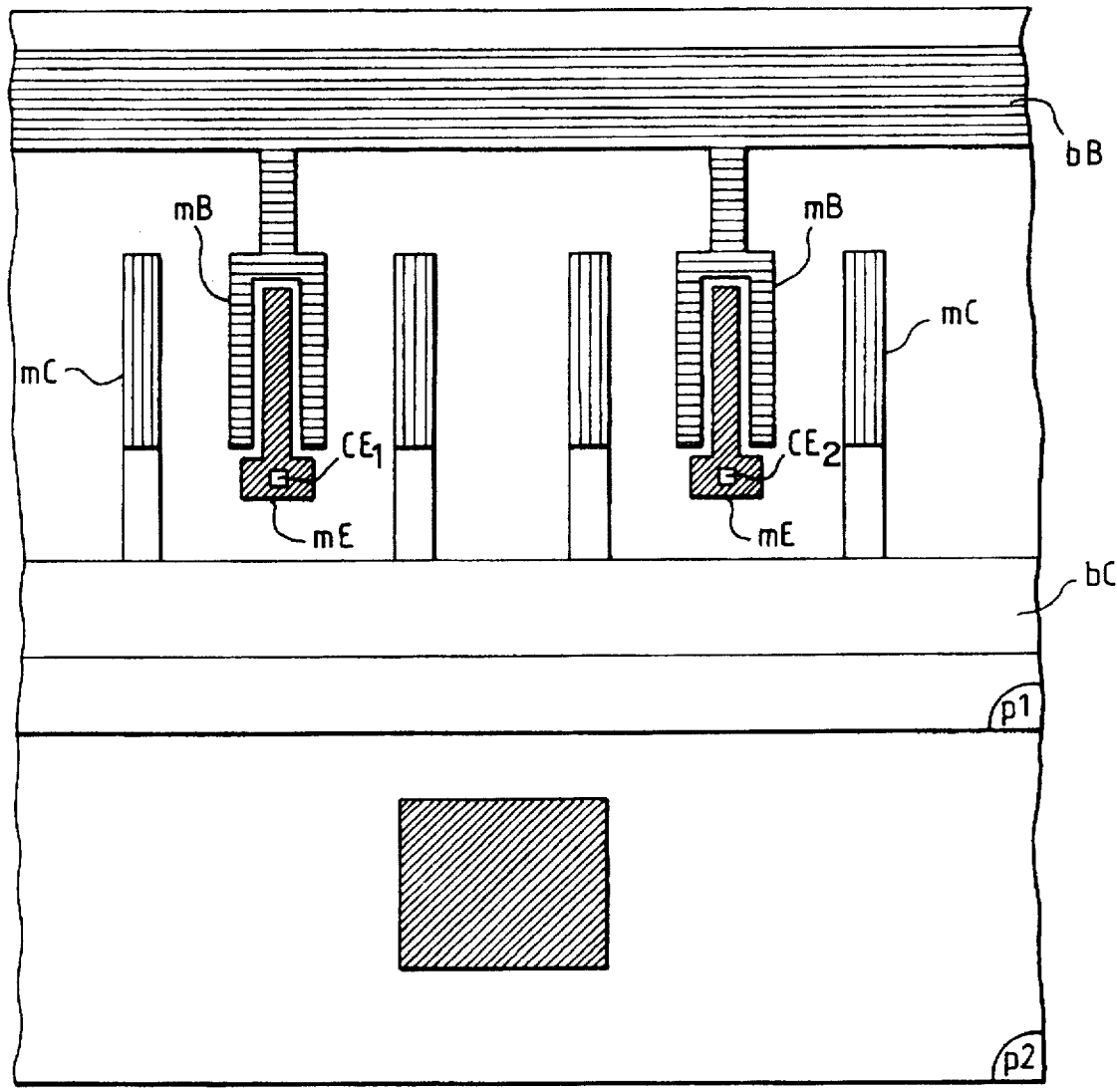
FIG. 3b shows a top view of two parallel-connected transistors in a component according to a first variant of the invention.

FIG. 3b shows a top view of the two associated transistors and shows the base bus bB and the collector bus bC enabling the contacts to be made laterally at the level of the bases and collectors. The points $CE_1$ and $CE_2$ pertain to electrical contacts taken at the emitters of the transistors.

This top view is sectioned at the emitter metallizations mE along a first plan $p_1$ and sectioned at the front face of the substrate along a second plane $p_2$.

The first part of the heat sink covers the plane $p_1$, the second part of the heat sink covers the plane $p_2$.

In the exemplary component described in FIG. 3, a via hole is shown at the plane $p_2$ enabling the connection of the heat sink with a ground plane located at the rear face of the substrate.

Typically, the rear face of the substrate can be metallized for example with gold after thinning to make the ground plane.

In a configuration of this kind, the ground connection through the substrate of the upper electrodes enables the cooling and homogenization of the temperature of the transistors, the dissipated heat being discharged firstly beneath the component through the substrate and secondly through the thick upper metallization constituted by the overhanging part of the heat sink.

Figure 4:
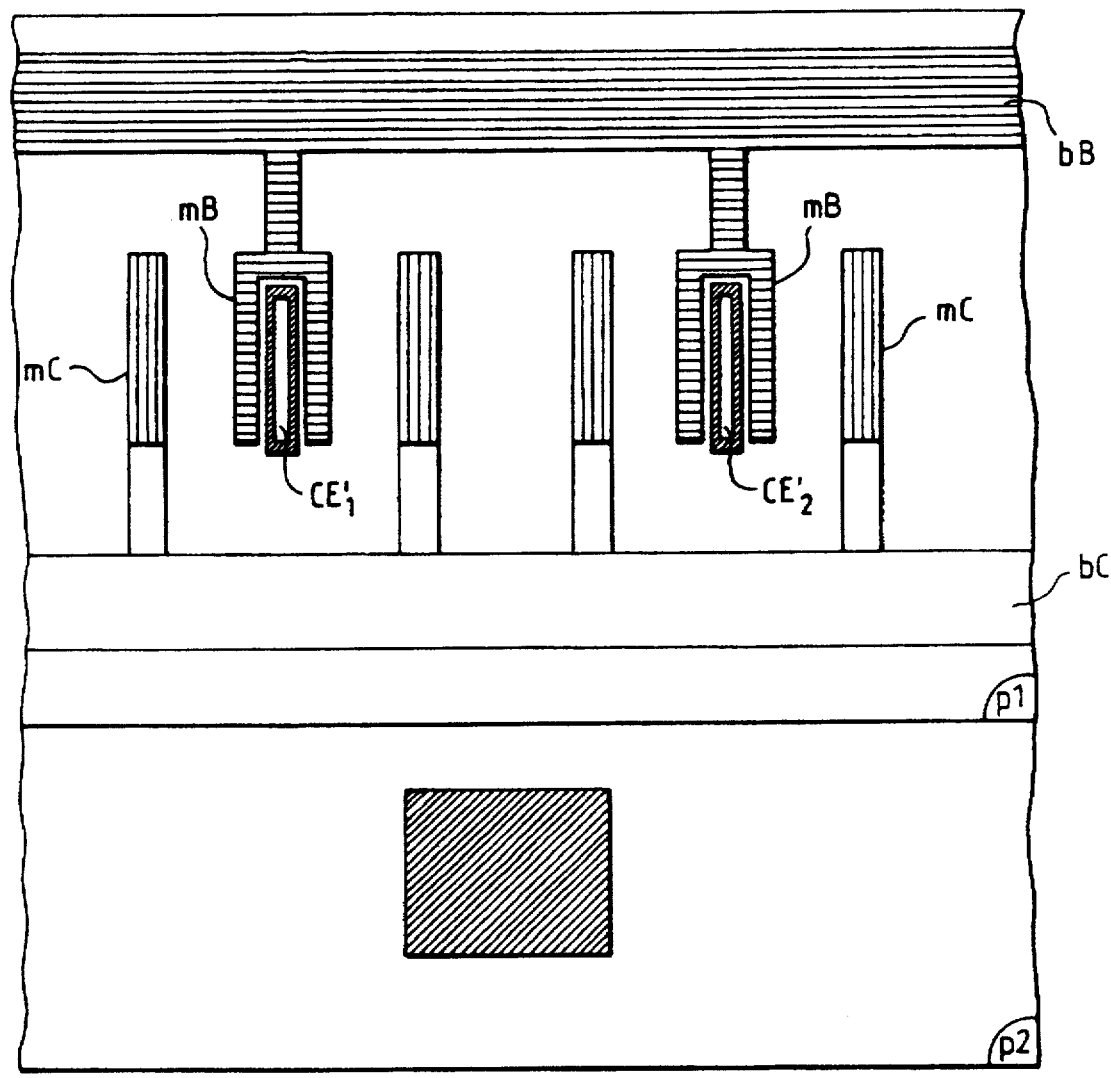
FIG. 4 illustrates two parallel-connected transistors in a component according to a second variant of the invention wherein the emitter contacts CE' are taken at the emitter fingers.

In a second variant of the invention shown in FIG. 4, the emitter contacts $CE'_1$ and $CE'_2$ are taken directly at each of the fingers and therefore an entire part of the layer CP is left clear at the emitter metallization mE.

To ensure adequate thermal coupling between the heat sink and the transistor, the passivation layer CP must have sufficient thermal conductivity. Typically, the material of the layer CP may be chosen from among SiN, GaN, Bn, SiC, or diamond.

The heat sink is formed by a metal that is a good conductor of heat. For example, this metal may be gold or copper.

To illustrate the value of the heat sink proposed herein, a comparison has been made of semiconductor components comprising structures having several elementary fingers with heat sink and without heat sink.

In the two types of component, each of the fingers has an emitter surface of 2×30 µm² with an inter-finger spacing of 32 µm.

Figure 5:
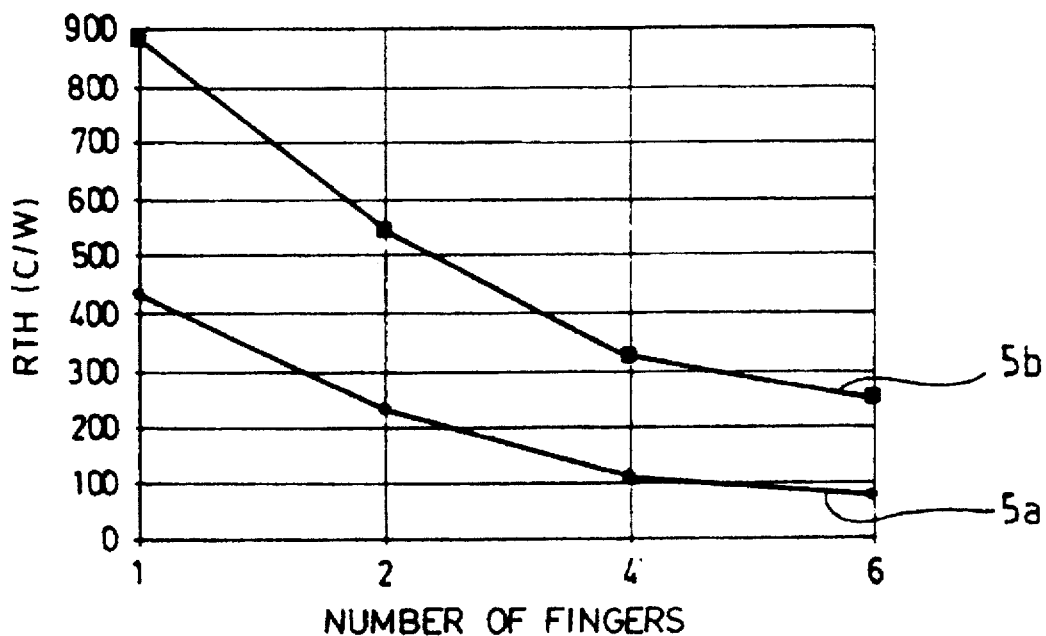
FIG. 5 shows the changes undergone by the thermal resistance as a function of the number of fingers possessed by components with heat sink and without heat sink.

FIG. 5 shows the changes undergone by the thermal resistance as a function of the number of fingers for components with heat sink (curve 5a) and without heat sink (curve 5b).

Figure 6:
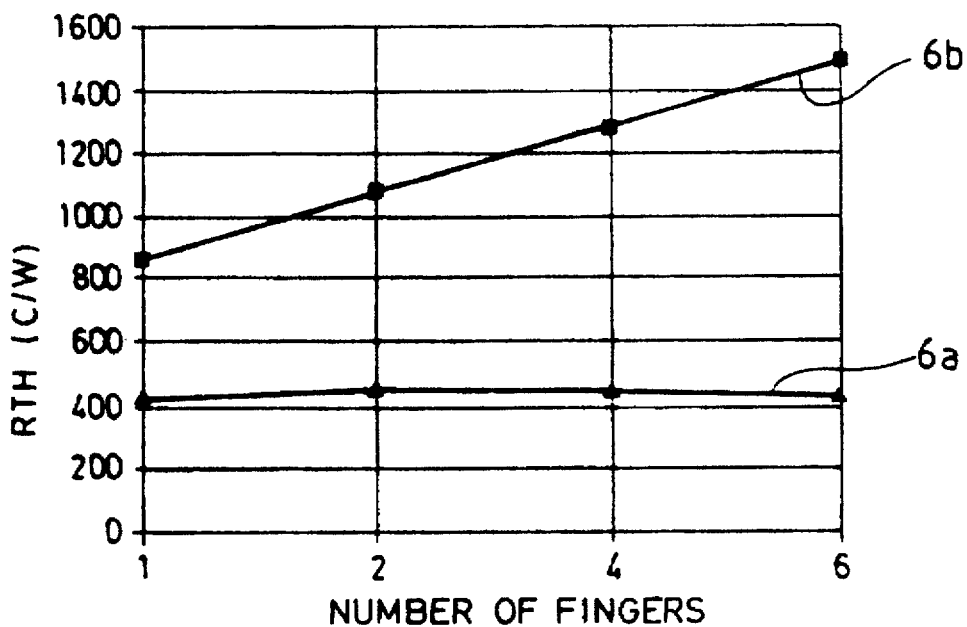
FIG. 6 illustrates the thermal resistance of an elementary finger as a function of the number of fingers in components with heat sink and without heat sink.

Furthermore, FIG. 6 shows the changes undergone by the thermal resistance of each of the fingers in a four-finger component with heat sink (curve 6a) and without heat sink (curve 6b).

It can be seen from FIGS. 5 and 6 that a major decrease in the thermal resistance is obtained through the presence of the heat sink and that when there is no heat sink, the thermal resistance increases linearly with the number of fingers. This is due to the thermal coupling between elementary fingers. By contrast, in the presence of the heat sink, each of the fingers appears to be thermally decoupled from its neighbors.

Furthermore, the diminishing of the thermal resistance improves both the electrical performance characteristics and the reliability of the component by diminishing its operating temperature.

Figure 7A:
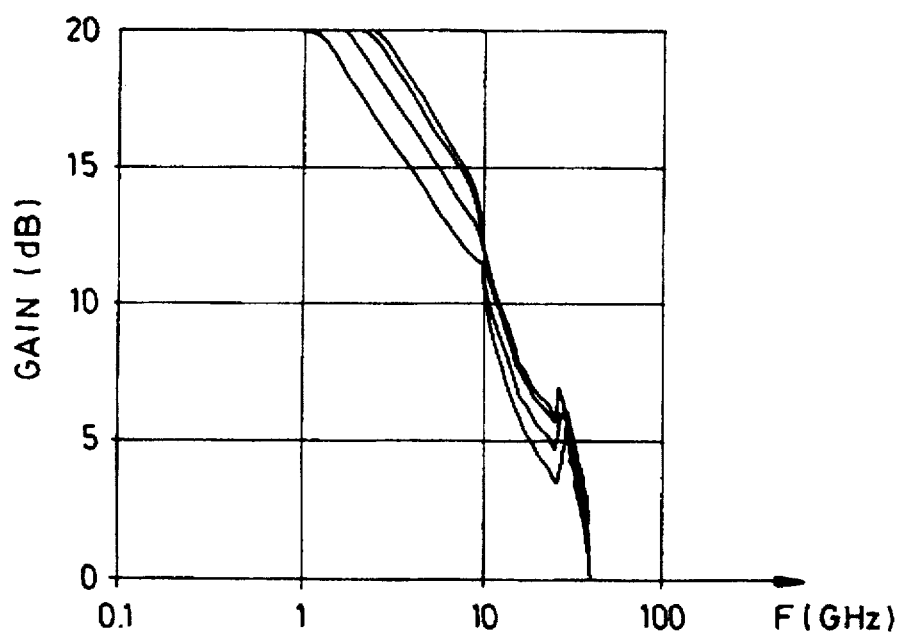
FIG. 7a shows the microwave gain as a function of the frequency for components without heat sink.
Figure 7B:
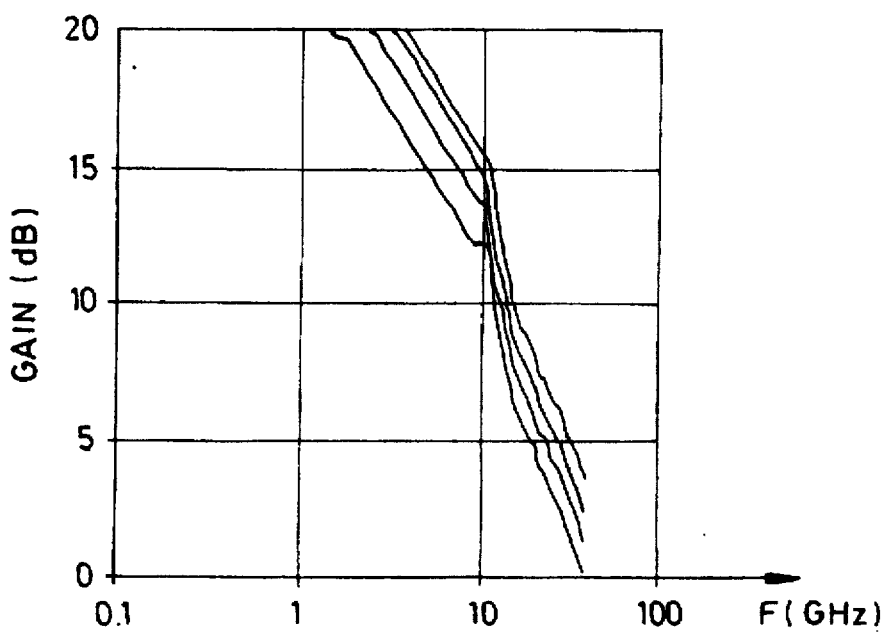
FIG. 7b shows the microwave gain as a function of the frequency for components with heat sink.

In this respect, FIG. 7 shows the progress of the microwave gain as a function of frequency for different collector currents (from 5 mA to 40 mA) for a voltage $V_{CE}$ between emitter and collector of 7V. FIG. 7a pertains to a component comprising a two-finger structure, without heat sink. FIG. 7b pertains to a component comprising a two-finger structure with heat sink. It can thus be seen that the microwave gain may be increased by 2 dB at a frequency of 10 GHz. This proves to be very great for the added power output of the devices.

A description shall now be given of an exemplary method for making a heat sink used in a component according to the invention, as illustrated in FIG. 3.

In a standard way, starting with layers epitaxially grown on a semiconductor substrate, the desired "double mesa" structure is made, enabling the preparation for example of bipolar transistors.

The entire unit is covered with a passivation layer CP.

Figure 8A:
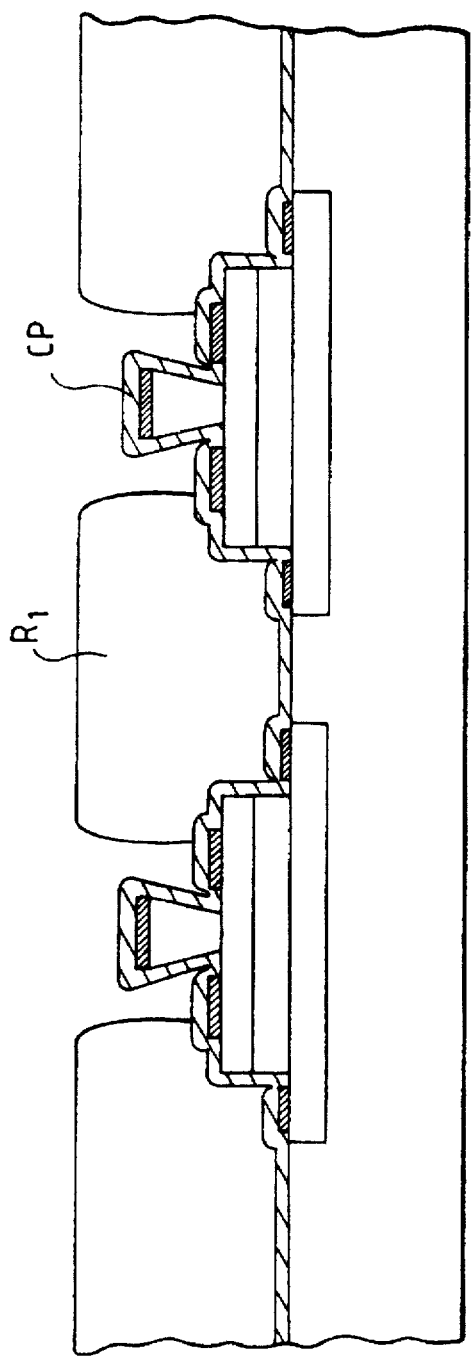
FIGS. 8a, 8b and 8c illustrate a method for the making of a heat sink coupled to bipolar transistors.

Then, a positive resin $R_1$ is deposited on this passivation layer CP. This positive resin $R_1$ is then locally insolated so as to clear the zones in which it is desired to implant the heat sink as shown in FIG. 8a (whether the parts involved are overhanging parts PI that are shown or parts PII that are not shown).

Figure 8B:
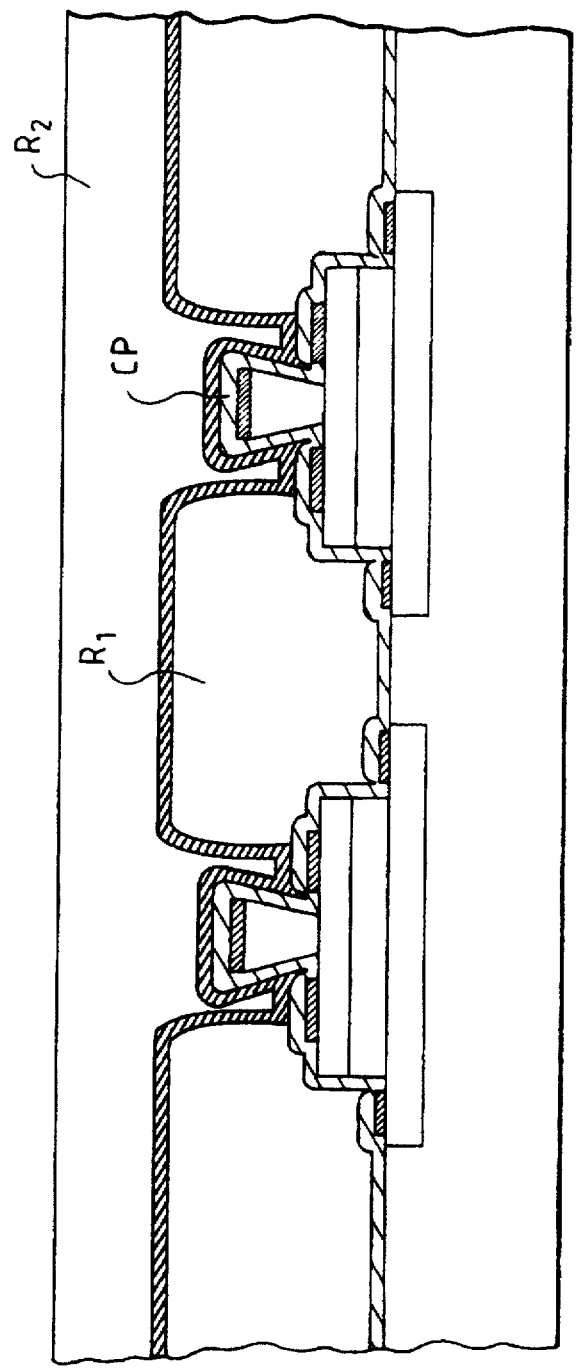
Figure 8C:
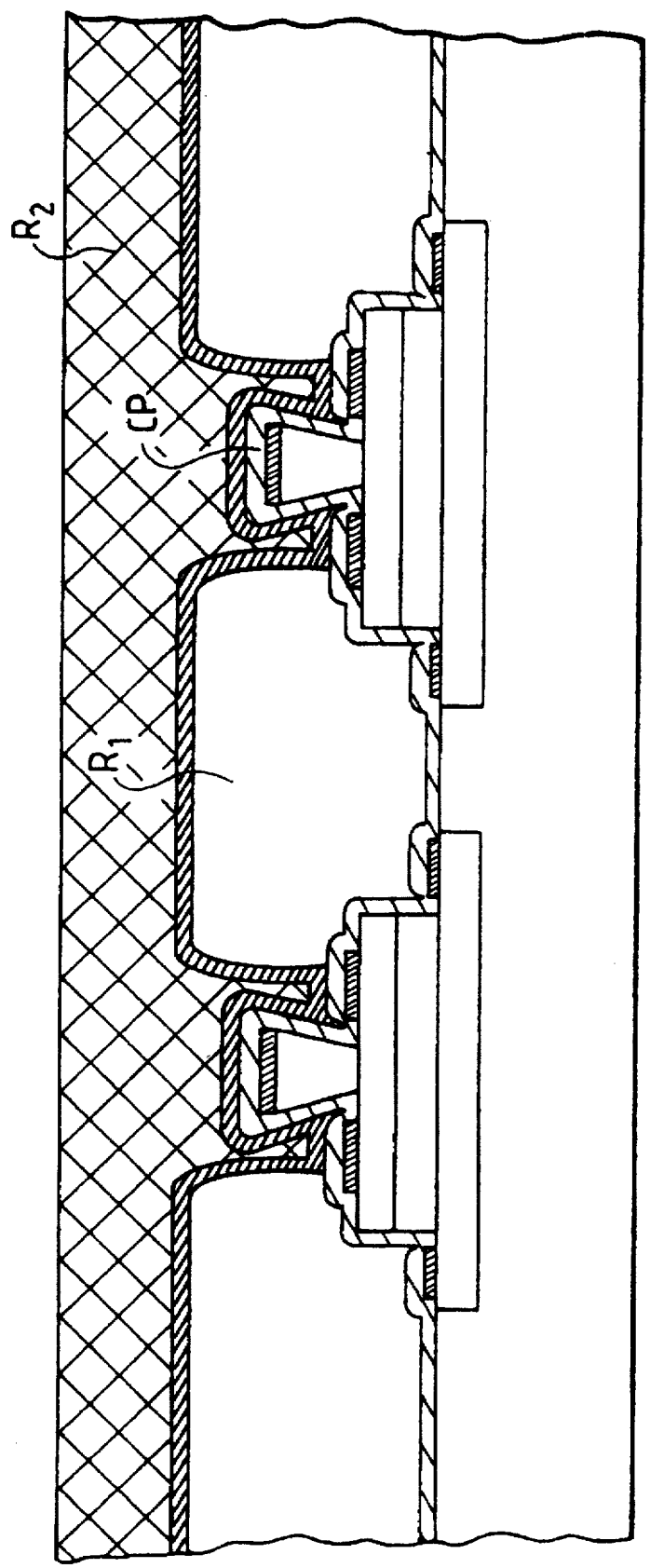

The entire unit is then covered with a thin metal layer obtained by evaporation. This thin metal layer will subsequently be used as an electrode for the deposition of electrolytic gold that will enable the making of the thick metal heat sink (FIG. 8b).

Above this thin metal layer, a resin $R_2$ is deposited. This resin $R_2$ is subsequently insolated at the place where the heat sink is made.

Electrolytic gold is deposited in a substantial thickness (typically about ten microns). This is the step for the making of the heat sink itself.

The thin metal layer is sprayed where there is no electrolytic gold.

The resin $R_1$ is removed from the unit so as to reveal the overhanging part PI of the heat sink.

What is claimed is:

1. A semiconductor device having at least one region called a mesa that is embossed with respect to a first face of the substrate called the front face, said region being the source of a substantial release of heat, the "mesa" and the front face being entirely covered with a passivation layer (CP), wherein the device comprises a thick metal heat sink comprising:

a first overhanging part (PI) in the shape of a bridge whose legs lie on the passivation layer (CP) at the level of a unit forming an embossed "mesa";

a second part covering the regions of the front face of the substrate other than those constituting the embossed "mesa".

2. A semiconductor device according to claim 1, comprising one or more parallel-connected transistors, each transistor having two successive mesas from the substrate, a first mesa formed by the base, a second mesa formed by the emitter, the first mesa comprising base metallizations (mB) on each side of the emitter, the second mesa comprising an emitter metallization (mE), the overhanging part (PI) of the heat sink resting on the layer (CP) at the level of the unit formed by the metallization (mE) and the metallizations (mB), the emitter contacts (CE) being offset with respect to the transistors.

3. A semiconductor device according to claim 1, comprising one or more parallel-connected transistors, each transistor having two successive mesas from the substrate, a first mesa formed by the base, a second mesa formed by the emitter, the first mesa comprising base metallizations (mB) on each side of the emitter, the second mesa comprising an emitter metallization (mE), the overhanging part PI of the heat sink resting on the unit formed by the metallization (mE) and the metallization (mB), partially on the layer (CP) and partially on the metallization (ME), the emitter contacts (CE') being taken directly on the transistors.

4. A semiconductor device according to claim 1, wherein the second part is connected to the rear face of the substrate by means of via holes through the substrate, said rear face having a metal ground plate.

5. A semiconductor device according to claim 2, wherein the transistors are GaInP/GaAs type heterojunction bipolar transistors.

6. A semiconductor device according to claim 1, wherein the passivation layer (CP) is of the SiN, GaN, BN or SiC type.

7. A semiconductor device according to claim 1, wherein the heat sink is made of metal that is a good conductor of heat, of the gold or copper type.

8. A semiconductor device according to claim 7, wherein the thickness of the heat sink is in the region of about ten microns.

* * * * *